US010816359B2

(12) United States Patent
Miyazaki

(10) Patent No.: US 10,816,359 B2
(45) Date of Patent: Oct. 27, 2020

(54) MEASURING DEVICE

(71) Applicant: FUJIDENOLO CO., LTD., Komaki-shi, Aichi (JP)

(72) Inventor: Hideki Miyazaki, Komaki (JP)

(73) Assignee: FUJIDENOLO CO., LTD., Komaki-shi, Aichi (JP)

(*) Notice: Subject to any disclaimer, the term of this patent is extended or adjusted under 35 U.S.C. 154(b) by 45 days.

(21) Appl. No.: 16/202,350

(22) Filed: Nov. 28, 2018

(65) Prior Publication Data

US 2019/0094043 A1 Mar. 28, 2019

Related U.S. Application Data

(63) Continuation-in-part of application No. PCT/JP2017/039904, filed on Nov. 6, 2017.

(30) Foreign Application Priority Data

Nov. 4, 2016 (JP) .................................. 2016-216746

(51) Int. Cl.
*G01D 5/12* (2006.01)
*G01D 5/14* (2006.01)
*G01R 33/02* (2006.01)

(52) U.S. Cl.
CPC .............. *G01D 5/12* (2013.01); *G01D 5/145* (2013.01); *G01R 33/02* (2013.01); *G01R 33/0206* (2013.01)

(58) Field of Classification Search
CPC ...... G01D 5/12; G01D 5/145; G01R 33/0206; G01R 33/02
See application file for complete search history.

(56) References Cited

U.S. PATENT DOCUMENTS 5,304,931 A * 4/1994 Flamig ................. G01R 33/446
324/309
5,731,996 A 3/1998 Gilbert
(Continued)

FOREIGN PATENT DOCUMENTS

DE 102015203686 9/2016
JP H06-66921 A 3/1994
(Continued)

OTHER PUBLICATIONS

English translation of International Search Report of International Application No. PCT/JP2017/039904.
(Continued)

*Primary Examiner* — Dominic E Hawkins
(74) *Attorney, Agent, or Firm* — Muncy, Geissler, Olds & Lowe, P.C.

(57) ABSTRACT

A measuring device includes at least two magnetic sensors capable of selectively measuring a magnitude of a component in a specific direction of a magnetic field. The measuring device repeatedly acquires, at a plurality of timings, a measurement value indicating the magnitude of the magnetic field detected by each of the at least two magnetic sensors. The measuring device identifies the measurement value having the largest absolute value, from among at least two measurement values acquired at a specific timing from each of the at least two magnetic sensors. The measuring device identifies a first magnetic sensor that has detected the identified measurement value having the largest absolute value. The measuring device identifies, based on a time change in the acquired measurement value, a distance in an orthogonal direction that is orthogonal to the specific direction, between an object to be measured and the identified first magnetic sensor.

6 Claims, 4 Drawing Sheets

(56) References Cited

U.S. PATENT DOCUMENTS

| | | | |
|---|---|---|---|
| 6,317,048 B1* | 11/2001 | Bomya | B60R 21/013 |
| | | | 180/274 |
| 2009/0171608 A1* | 7/2009 | Handa | G01C 17/28 |
| | | | 702/92 |
| 2010/0013461 A1 | 1/2010 | Masubuchi et al. | |
| 2010/0085041 A1 | 4/2010 | Pozidis et al. | |
| 2010/0277163 A1* | 11/2010 | Nakamura | G01B 7/003 |
| | | | 324/228 |
| 2013/0027028 A1 | 1/2013 | Hohe et al. | |
| 2015/0247903 A1* | 9/2015 | Maurio | G01R 33/04 |
| | | | 324/207.13 |
| 2016/0084652 A1* | 3/2016 | Sekitsuka | G01C 17/28 |
| | | | 702/94 |
| 2016/0338608 A1* | 11/2016 | Nagasaka | G01R 33/028 |
| 2017/0299663 A1* | 10/2017 | Nagasaka | G01R 33/032 |

FOREIGN PATENT DOCUMENTS

| | | |
|---|---|---|
| JP | 2014-101273 A | 4/2004 |
| JP | 2010-025599 A | 2/2010 |
| JP | 2011-070621 A | 4/2011 |
| WO | 2012025763 | 3/2012 |

OTHER PUBLICATIONS

Written Opinion of International Application No. PCT/JP2017/039904 dated Jan. 30, 2018 and English translation thereof.
The extended European search report of the corresponding EP application No. 17867944.5 dated May 12, 2020.

* cited by examiner

MEASURING DEVICE

CROSS-REFERENCE TO RELATED APPLICATION

This application is a continuation-in-part of International Application No. PCT/JP2017/039904, filed Nov. 6, 2017, which claims priority from Japanese Patent Application No. 2016-216746, filed on Nov. 4, 2016. The disclosure of the foregoing application is hereby incorporated by reference in its entirety.

BACKGROUND

The present disclosure relates to a measuring device that measures a distance to a magnetic body.

In a measuring device that measures the distance to a magnetic body to be measured, normally at least three magnetic sensors are three-dimensionally arranged. A position localizing device is known that has three single axis magnetometers are arranged so as to form a plane. Each single axis magnetometer detects the magnitude of a magnetic field that fluctuates according to the distance to a moving object, and outputs a signal indicative of the detection result to a computer. The computer then identifies the trajectory of movement of the moving body and the position of the moving body, based on the signals output from the three single axis magnetometers.

SUMMARY

In the position localizing device described above, the three magnetic sensors are arranged so as to form a plane, so the installation area may be a wide area. In this case, there is a possibility that the device will be large.

An object of the present disclosure is to provide a measuring device that can measure a distance to a magnetic body and that can be small.

Various embodiments herein provide a measuring device including at least two magnetic sensors, processor, and a memory. The at least two magnetic sensors are capable of selectively measuring a magnitude of a component in a specific direction of a magnetic field. The at least two magnetic sensors are arranged lined up in the specific direction. The specific direction is a specific single linear direction. The memory configured to store computer-readable instructions. When executed by the processor, the computer-readable instructions instruct the processor to perform processes. The processes include repeatedly acquiring, at a plurality of timings, a measurement value indicating the magnitude of the magnetic field detected by each of the at least two magnetic sensors. The process further include identifying the measurement value having the largest absolute value, from among at least two measurement values acquired at a specific timing from each of the at least two magnetic sensors. The processes further include identifying a first magnetic sensor that has detected the identified measurement value having the largest absolute value. The process further include identifying, based on a time change in the acquired measurement value, a distance in an orthogonal direction that is orthogonal to the specific direction, between an object to be measured and the identified first magnetic sensor.

BRIEF DESCRIPTION OF DRAWINGS

Embodiments will be described below in detail with reference to the accompanying drawings in which.

DETAILED DESCRIPTION

<Outline of Measuring Device 1>

Figure 1:
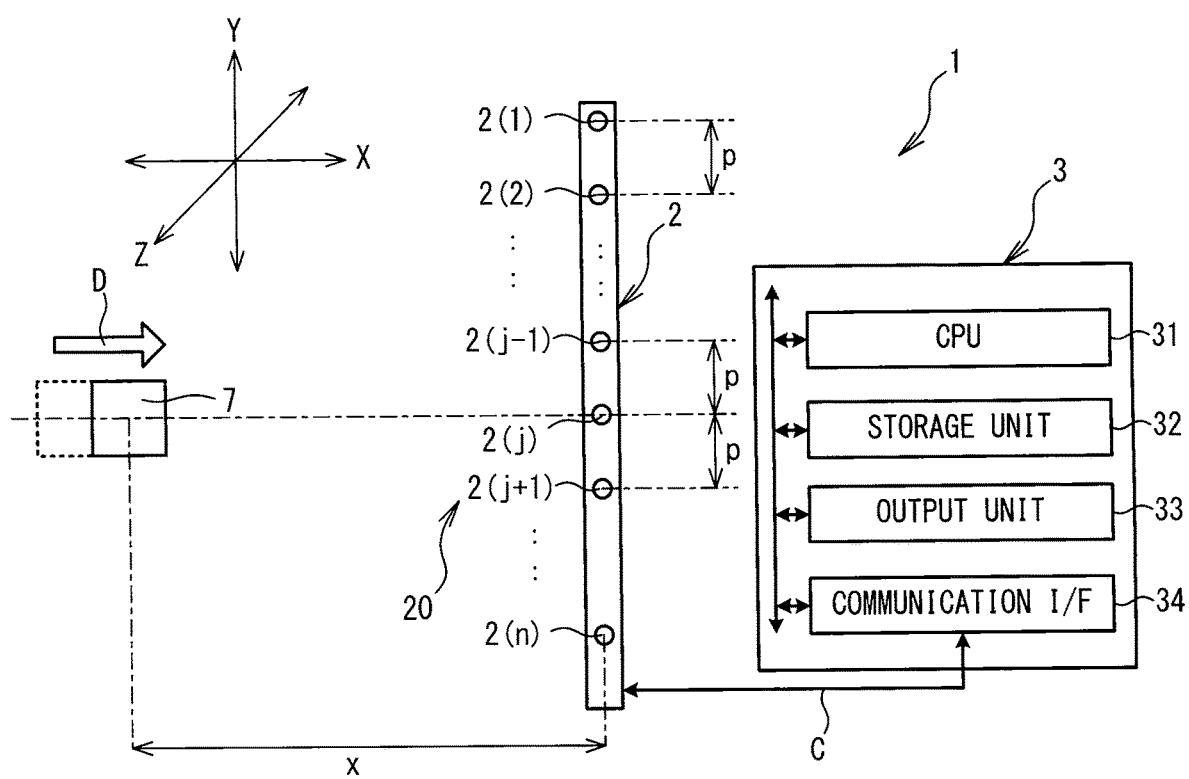
FIG. 1 is a view showing an outline of a measuring device and an electrical configuration of a control unit.

One embodiment of a measuring device 1 according to the present disclosure will be described with reference to the drawings. As shown in FIG. 1, the measuring device 1 is a device capable of measuring a distance to an object to be measured 7 that includes a magnetic body, and a magnitude of a magnetic moment of the object to be measured 7. The measuring device 1 includes a sensor unit 2 and a control unit 3. The sensor unit 2 and the control unit 3 are communicatively connected via a cable C.

The sensor unit 2 includes magnetic sensors 2(1), 2(2) . . . (2j−1), 2(j), 2(j+1) . . . 2(n) (n is an integer and j is an integer smaller than n) (hereinafter, these will collectively be referred to as "magnetic sensors 20"). The magnetic sensors 20 are able to selectively measure the magnitude of a component in a specific direction of a magnetic field. One specific example of the magnetic sensors 20 is a well-known MI sensor that uses the magnetoimpedance effect of an amorphous magnetic wire (Magneto-Impedance element MI effect). The magnetic sensors 2(1), 2(2) . . . 2(n) are sequentially arranged lined up at equally spaced intervals in the direction (the specific direction) of a component of the magnetic field that can be detected.

The interval between one of the magnetic sensors 20 and another adjacent magnetic sensor 20 will be denoted as p. The specific direction will be referred to as the "Y direction" and orthogonal directions orthogonal to the Y direction will be referred to as the "X direction" and the "Z direction". It will be assumed that the object to be measured 7 is moving in direction D toward the sensor unit 2 along the X direction.

The magnetic sensors 20 each output a signal indicative of a value (hereinafter, referred to as "measurement value") indicative of the strength of a component in the Y direction of the detected magnetic field to the control unit 3 (described later) via the cable C.

The control unit 3 is a well-known PC. The control unit 3 includes a CPU 31, a storage unit 32, an output unit 33, and a communication interface (communication I/F) 34. The CPU 31 executes main processing (refer to FIG. 4; described later) based on a program stored in the storage unit 32. In the main processing, a distance to be measured and a moment to be measured are identified based on measurement values (hereinafter, rephrased as "measurement values detected by the magnetic sensors 20") indicated by signals output from the magnetic sensors 20. The distance to be measured is the shortest distance in the X direction between the object to be measured 7 and the sensor unit 2. The moment to be measured is the magnitude of the component in the Y direction, of the magnetic moment of the object to be measured 7. The storage unit 32 stores a program to be executed by the CPU 31. The output unit 33 is an LCD. The output unit 33 displays the calculated distance to be measured and moment to be measured. The communication I/F

34 is an interface element for communicating with the sensor unit 2 via the cable C. The CPU 31 is electrically connected to the storage unit 32, the output unit 33, and the communication I/F 34.

<Method for Identifying Distance to be Measured>

The method for identifying the distance to be measured will be described. The magnetic field distribution in a three-dimensional space created by the magnetic moment of a magnetic body of the object to be measured 7 is expressed by Equation (1). Note that a magnetic flux density vector created by a magnetic dipole of the object to be measured 7 is denoted by B. A magnetic dipole moment vector is denoted by m'. A distance vector from the magnetic dipole is denoted by r'. The absolute value of the distance from the magnetic dipole is denoted by r.

[Equation 1]

$$B = \frac{\mu_0}{4\pi} \frac{1}{r^3} \left[ \frac{3(m' \cdot r')r'}{r^2} - m' \right] \quad (1)$$

A case will be assumed in which the object to be measured 7 approaches a contact point separated by a distance x in the X direction from the jth magnetic sensor 2(*j*), in a state in which the magnetic sensors 20 are lined up at equally spaced intervals with an interval p in the Y direction (refer to FIG. 1). At this time, when the ith (i is an integer equal to or less than n) magnetic sensor 2(*i*) detects a component in the Y direction of the magnetic field component created by the magnetic dipole of the object to be measured 7, the detected magnetic flux density vector $B_i$ is expressed by Equation (2). Note that the proportional constant is denoted by k. The strength of the magnetic moment is denoted by m. The direction angle of the magnetic moment is denoted by θ.

[Equation 2]

$$B_i = \frac{km \sin \theta}{\left[\sqrt{\{(i-j)p\}^2 + x^2}\right]^3} \left[ \frac{3(i-j)p}{\left[\sqrt{\{(i-j)p\}^2 + x^2}\right]^2} - 1 \right] \quad (2)$$

The magnetic flux density vector $B_j$ detected by the magnetic sensor 2(*j*) that is in a position in the Y direction that matches the object to be measured 7 is expressed by Equation (3) by substituting i=j into Equation (2).

[Equation 3]

$$B_j = \frac{km \sin \theta}{x^3} \quad (3)$$

The magnetic flux density vectors $B_{j+1}$ and $B_{j-1}$ detected by the magnetic sensors 2(*j*−1) and 2(*j*+1) adjacent to the magnetic sensor 2(*j*) are expressed by Equation (4) by substituting i−j=±1 into Equation (2).

[Equation 4]

$$B_{j+1} = B_{j-1} = \frac{km \sin \theta}{\left[\sqrt{p^2 + x^2}\right]^3} \left[ \frac{3p}{p^2 + x^2} - 1 \right] \quad (4)$$

When the magnetic flux density vector $B_j$ detected by the jth magnetic sensor 2(*j*) and the magnetic flux density vectors $B_{j+1}$ and $B_{j-1}$ detected by the magnetic sensors 2(*j*−1) and 2(*j*+1) adjacent to the magnetic sensor 2(*j*) are each time-differentiated, they are expressed by Equations (5) and (6), where Equation (5) shows the result $dB_j/dt$ obtained by time-differentiating the magnetic flux density vector $B_j$, and Equation (6) shows the result $dB_{j+1}/dt$ and $dB_{j-1}/dt$ obtained by time-differentiating the magnetic flux density vectors $B_{j+1}$ and $B_{j-1}$. Also, it is assumed that θ does not fluctuate according to a time change.

[Equation 5]

$$\frac{dB_j}{dt} = \frac{3km \sin \theta}{x^4} \frac{dx}{dt} \quad (5)$$

[Equation 6]

$$\frac{dB_{j-1}}{dt} = \frac{dB_{j+1}}{dt} = 3km \sin \theta \frac{x(p^2 - 5p + x^2)}{(p^2 + x^2)^{3.5}} \frac{dx}{dt} \quad (6)$$

When the ratio of Equation (5) and Equation (6) is calculated, it is expressed by Equation (7), where the ratio is denoted by $B_r$. Here, $B_r$ is calculated with the smaller value of $dB_j/dt$, and $dB_{j+1}/dt$ and $dB_{j-1}/dt$, as the numerator, and the larger value as the denominator. Therefore, $B_r$ is always a value equal to or greater than 1. In the following description, it will be assumed that $dB_{j+1}/dt$ and $dB_{j-1}/dt$ are smaller than $dB_j/dt$.

[Equation 7]

$$\frac{\frac{dB_j}{dt}}{\frac{dB_{j-1}}{dt}} = B_r = \frac{\frac{3km \sin \theta}{x^4} \frac{dx}{dt}}{3km \sin \theta \frac{x(p^2 - 5p + x^2)}{(p^2 + x^2)^{3.5}} \frac{dx}{dt}} = \frac{(p^2 + x^2)^{3.5}}{x^5(p^2 - 5p + x^2)} \quad (7)$$

The ratio $B_r$ of $dB_j/dt$ that is the result of differentiating the magnetic flux density vector $B_j$, and $dB_{j+1}/dt$ and $dB_{j-1}/dt$ that is the result of differentiating the magnetic flux density vectors $B_{j+1}$ and $B_{j-1}$, can easily be calculated based on the measurement values detected by the magnetic sensors 2(*j*) and 2(*j*+1) or the magnetic sensors 2(*j*) and 2(*j*−1). Also, the interval p is a known parameter constituting the sensor unit 2. Therefore, the only indefinite parameter in Equation (7) is the distance x. Therefore, the distance x can, in principle, be calculated based on Equation (7).

Figure 2:
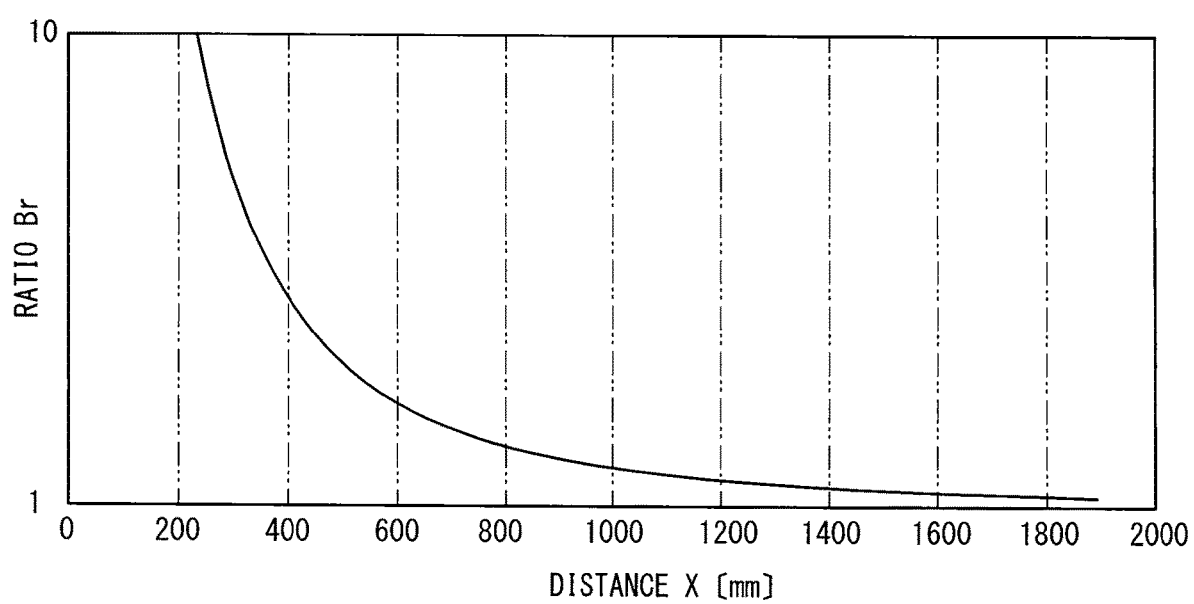
FIG. 2 is a graph showing the relationship between a distance x and a ratio $B_r$.

However, Equation (7) is a polynomial equation including a power of the fifth or higher order of x, so when the distance x is calculated based on Equation (7), a large processing load is applied to the CPU 31. Therefore, in the present embodiment, the ratio $B_r$ to the distance x is calculated in advance by substituting the interval p between the magnetic sensors 20 into Equation (7), and a graph (refer to FIG. 2) showing the corresponding relationship between x and $B_r$ is derived. The graph shown in FIG. 2 shows the relationship between the distance x [mm] (horizontal axis) and the ratio $B_r$ (vertical axis) when the interval p is 280 mm. The measuring device 1 applies the ratio $B_r$ calculated based on the measurement values detected by the magnetic sensors 2(*j*) and 2(*j*+1) or the magnetic sensors 2(*j*) and 2(*j*−1) to this graph. As a result, the measuring device 1 is able to unambiguously calculate the distance x.

Also, the measuring device 1 can calculate the distance x by the following method, in addition to the method of applying the graph shown in FIG. 2. The relationship between the distance x and the ratio $B_r$ can be accurately approximated by Equation (8), where A and B both represent constants.

[Equation 8]

$$x = A\sqrt{\frac{1}{LN\,(Br)}} + B \qquad (8)$$

Figure 3:
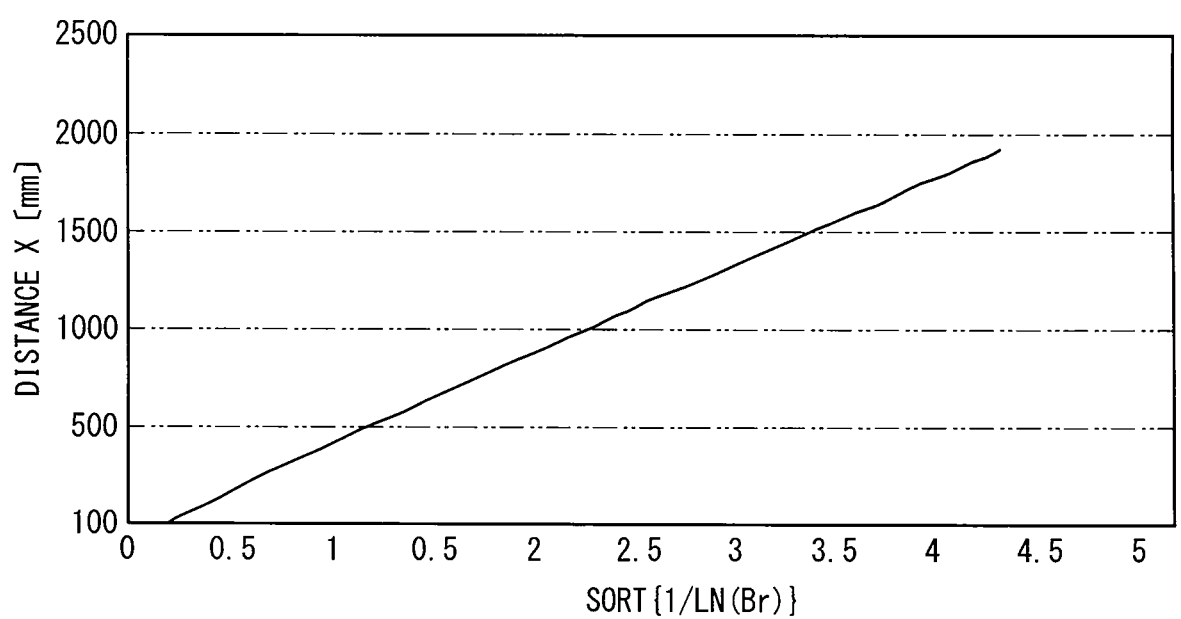
FIG. 3 is a graph showing the relationship between $(1/LN(B_r))^{1/2}$ and the distance x.

FIG. 3 is a graph showing the relationship between $(1/LN(B_r))^{1/2}$ (horizontal axis) and the distance x (vertical axis). A correlative relationship is 0.999. Therefore, the measuring device 1 calculates the constants A and B in advance based on the interval p between the magnetic sensors 20, and by using these constants, can then easily calculate the distance x by linear calculation.

Note that the absolute value of the measurement values detected by the magnetic sensors 20 becomes larger closer to the object to be measured 7. In FIG. 1, the positions of the object to be measured 7 and the magnetic sensor 2(*j*) in the Y direction match, so the magnetic sensor 2(*j*) is closest to the object to be measured 7. Therefore, the measurement value detected by the magnetic sensor 2(*j*) is larger than the measurement values detected by the other magnetic sensors 2(1) to 2(*j*−1) and 2(*j*+1) to 2(*n*). That is, the magnetic sensor 20 that has detected measurement value having the largest absolute value is in a position in the Y direction that substantially matches the object to be measured 7. Therefore, the measuring device 1 can identify the distance to be measured between the magnetic sensor 2(*j*) and the object to be measured 7 by selecting the magnetic sensor 20 that has detected the measurement value having the largest absolute value and setting this magnetic sensor 20 as the magnetic sensor 2(*j*) in Equations (1) to (8), and calculating the distance x.

<Method for Calculating Moment to be Measured>

The method for calculating the moment to be measured will now be described. First, the calculated distance x is substituted into Equation (3). $B_j$ is the magnetic flux density vector detected by the jth magnetic sensor 2(*j*). However, the ambient magnetic field affects $B_j$. For this reason, the magnitude of the ambient magnetic field is identified in advance, and the magnitude of the ambient magnetic field is subtracted from $B_j$ to calculate a magnetic flux density vector b from which the effect of the ambient magnetic field has been eliminated, as shown in Equation (9), where the magnitude of the ambient magnetic field is denoted by BE.

[Equation 9]

$$B_j - BE = b = -\frac{km\sin\theta}{x^3} \qquad (9)$$

Equation (10) is derived by transforming Equation (9).

[Equation 10]

$$m\sin\theta = m_y = \frac{x^3 b}{k} \qquad (10)$$

m is a scalar quantity indicating the magnitude of the magnetic moment. However, because m is multiplied by sin θ, the amount that can be obtained is the magnitude $m_y$ of the component in the Y direction, of the magnetic moment. Therefore, the magnitude $m_y$ of the component in the Y direction of the magnetic moment of the object to be measured 7 can be calculated by applying Equation (10). Here, when the distance to be measured is used as the distance x substituted into Equation (10), the calculated $m_y$ corresponds to the moment to be measured.

Note that when the magnetic sensors 20 are arranged on three mutually orthogonal axes, for example, the measuring device 1 can calculate the magnitude m of the magnetic moment itself by Equation (11), where the magnitude of the component in the X direction of the magnetic moment is denoted by $m_x$, and the magnitude of the component in the Z direction of the magnetic moment is denoted by $m_z$.

[Equation 11]

$$m = \sqrt{m_x^2 + m_y^2 + m_z^2} \qquad (11)$$

<Main Processing>

Figure 4:
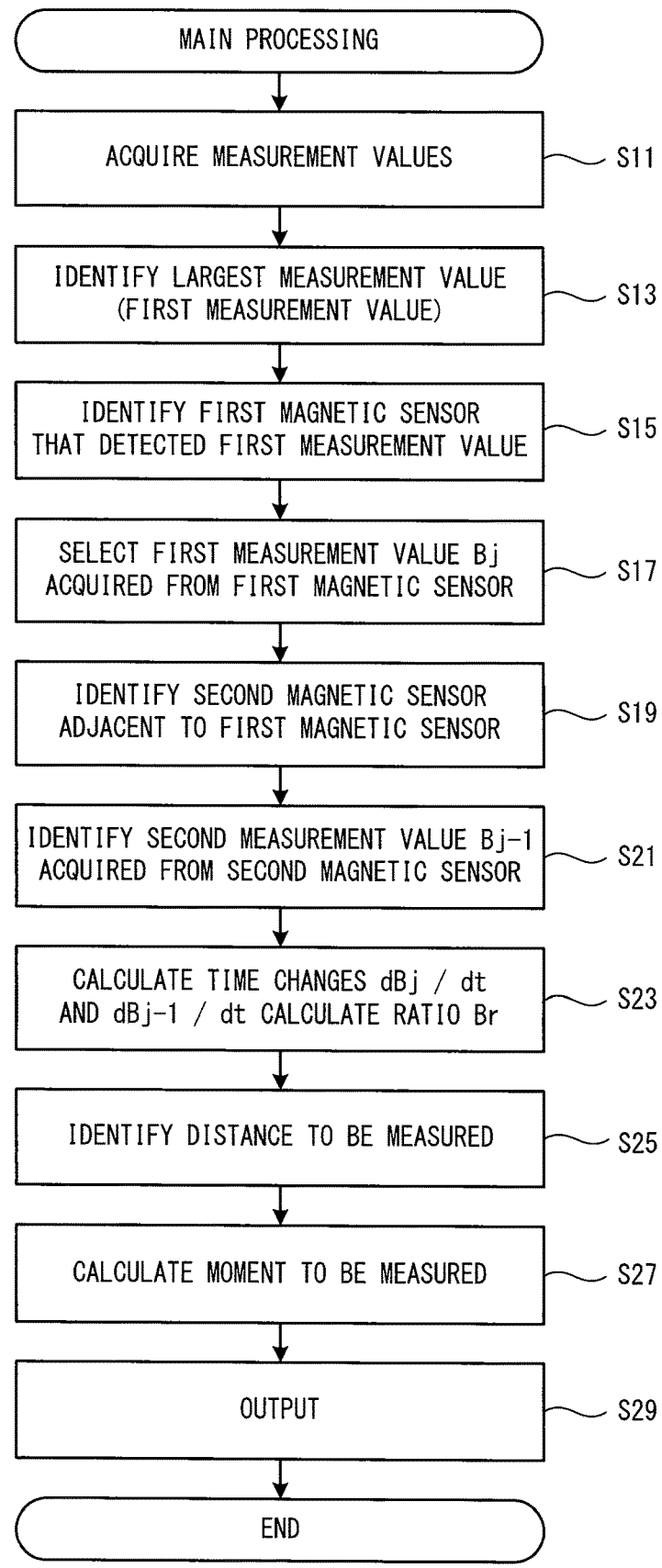
FIG. 4 is a flowchart illustrating main processing.

Main processing will be described with reference to FIG. 4. The main processing starts by the CPU 31 executing a program stored in the storage unit 32, when an instruction to start measuring the distance to be measured to the object to be measured 7 and the moment to be measured of the object to be measured 7 is input to the measuring device 1. In the main processing, the constants A and B stored in the storage unit 32 (refer to Equation (8)) and the magnitude BE of the ambient magnetic field (refer to Equation (9)) are referred to.

The CPU 31 repeatedly acquires the measurement values detected by the magnetic sensors 20 from all of the magnetic sensors 2(1), 2(2), . . . 2(*n*) at predetermined cycles (S11). The CPU 31 identifies the measurement value having the largest absolute value, from among n number of measurement values acquired at a specific cycle (S13). The CPU 31 further identifies the magnetic sensor 20 that has detected the measurement value having the largest absolute value (S15). The CPU 31 selects a plurality of measurement values repeatedly acquired at predetermined cycles from the magnetic sensor 20 identified by the processing in step S15 (S17).

Hereinafter, the magnetic sensor 20 identified by the processing in step S15, i.e., the magnetic sensor 20 with the largest absolute value of the measurement value acquired at a specific cycle, from among the magnetic sensors 2(1), 2(2), . . . 2(*n*), will be referred to as "first magnetic sensor." The plurality of measurement values selected by the processing in step S17, i.e., the plurality of measurement values repeatedly acquired at predetermined cycles from the first magnetic sensor, will be referred to as "first measurement value." Hereinafter, an example of a case where the magnetic sensor 2(*j*) has been identified as the first magnetic sensor will be described in detail. The first measurement value corresponds to $B_j$.

The CPU 31 identifies one of the magnetic sensors 2(*j*+1) and 2(*j*−1) adjacent to the first magnetic sensor 2(*j*) (S19). The CPU 31 selects a plurality of measurement values repeatedly acquired at predetermined cycles from the identified one of the magnetic sensors 2(*j*+1) and 2(*j*−1) (S21).

Hereinafter, the magnetic sensor 20 identified by the processing in step S19, i.e., the magnetic sensor adjacent to the first magnetic sensor, will be referred to as "second magnetic sensor." The plurality of measurement values selected by the processing in step S21, i.e., the plurality of measurement values repeatedly acquired at predetermined cycles from the second magnetic sensor, will be referred to as "second measurement value." Hereinafter, an example of a case where the magnetic sensor $2(j-1)$ has been identified as the second magnetic sensor will be described in detail. The second measurement value corresponds to $B_{j-1}$.

The CPU 31 calculates time changes $dB_j/dt$ and $dB_{j-1}/dt$ by time-differentiating both the first measurement value $B_j$ selected by the processing in step S17 and the second measurement value $B_{j-1}$ selected by the processing in step S21 (S23). The CPU 31 further calculates the ratio $B_r$ of the time change $dB_j/dt$ of the first measurement value $B_j$ to the time change $dB_{j-1}/dt$ of the second measurement value $Bj-1$ (S23). The CPU 31 calculates the distance x by substituting the calculated ratio Br and the constants A and B stored in the storage unit 32 into Equation (8) (S25). The calculated distance x corresponds to the distance between the object to be measured 7 and the magnetic sensor $2(j)$ closest in the X direction to the object to be measured 7, i.e., the distance to be measured.

The CPU 31 substitutes the first measurement value $B_j$, the distance x calculated by the processing in step S25, and the magnitude BE of the ambient magnetic field stored in the storage unit 32 into Equation (9). The CPU 31 transforms Equation (9) into which each of the values is substituted, and derives Equation (10). Accordingly, the CPU 31 calculates the magnetic moment $m_y$ (S27). The calculated magnetic moment $m_y$ corresponds to the magnitude of the component in the Y direction of the magnetic moment m of the object to be measured 7, i.e., the moment to be measured.

The CPU 31 outputs the calculated distance to be measured and moment to be measured to the output unit 33 (S29). The CPU 31 then ends the main processing.

<Examples of Operation and Effects of the Present Embodiment>

As described above, in the measuring device 1, the magnetic sensors 20 capable of selectively measuring the magnitude of the component in the Y direction of the magnetic field are arranged in the Y direction. The CPU 31 of the measuring device 1 can identify the distance to be measured, which is the distance in the X direction between the first magnetic sensor $2(j)$ and the object to be measured 7, based on the measurement values detected by the magnetic sensors 20 (S25). Because the magnetic sensors $2(1)$, $2(2) \ldots 2(n)$ can be arranged lined up in the Y direction, the measuring device 1 does not need to arrange the magnetic sensors 20 two-dimensionally or three-dimensionally. Therefore, the measuring device 1 can limit the area where the magnetic sensors 20 are arranged to the Y direction, so the sensor unit 2 can be reduced in size.

The CPU 31 obtains the time change $dB_j/dt$ by time-differentiating the first measurement value $B_j$ detected by the first magnetic sensor $2(j)$. The CPU 31 obtains the time changes $dB_{j-1}/dt$ and $dB_{j+1}/dt$ by time-differentiating the second measurement values $B_{j-1}$ and $B_{j+1}$ detected by the second magnetic sensor $2(j-1)$ or $2(j+1)$. The CPU 31 identifies the distance to be measured by substituting the ratio $B_r$ of $dB_j/dt$ and $B_{j-1}/dt$ or $dB_{j+1}/dt$ into Equation (8). In this case, in the measuring device 1, the distance to be measured can be appropriately identified even if the magnetic sensors $2(1)$, $2(2) \ldots 2(n)$ are arranged in the Y direction. Also, the distance to be measured can be identified using an approximate equation represented by the constants A and B (refer to Equation (8)), so the processing load of the CPU 31 can be reduced.

The CPU 31 further substitutes the first measurement value $B_j$ detected by the first magnetic sensor $2(j)$, the distance x, and the magnitude BE of the ambient magnetic field into Equation (9). As a result, the CPU 31 can identify the magnitude of the component in the Y direction of the magnetic moment of the object to be measured 7 as the moment to be measured (S27). Therefore, the measuring device 1 can identify not only the distance x (distance to be measured) in the X direction between the magnetic sensor $2(j)$ and the object to be measured 7, but also the magnitude of the magnetic moment of the object to be measured 7 (moment to be measured).

Modified Examples

The present disclosure is not limited to the embodiment described above, and can be modified in any of a variety of ways. The control unit 3 of the measuring device 1 may be a special device that includes a CPU capable of executing the main processing. The measuring device 1 may have a configuration in which the sensor unit 2 and the control unit 3 are integrated. The main processing may be distributed among a plurality of devices (e.g., ASIC) that include CPUs and executed by these devices.

The number of magnetic sensors 20 is not particularly limited as long as it is two or more. The intervals of the magnetic sensors 20 arranged in the Y direction do not have to be equally spaced intervals. For example, the intervals of the magnetic sensors 20 may become longer closer to an end portion in the Y direction of the sensor unit 2 and become shorter closer to the center in the Y direction of the sensor unit 2. The magnetic sensors 20 are not limited to MI sensors, and may be other magnetic sensors capable of selectively detecting the magnitude of a component in a specific direction of a magnetic field. The interval at which the measurement values are acquired from the plurality of the magnetic sensors 20 need not be a predetermined cycle. The direction of movement of the object to be measured 7 is not limited to the direction along the X direction, and may be any direction. In this case, the measuring device 1 can calculate the distance to be measured and the moment to be measured, based on a component along the X direction, in the direction of movement of the object to be measured 7.

The measuring device 1 may separately include a plurality of magnetic sensors 20 arranged in the Y direction or the Z direction. The CPU 31 may calculate the magnitude m of the magnetic moment of the object to be measured 7 based on the measurement values detected by these magnetic sensors 20.

The CPU 31 may directly calculate the distance to be measured, by substituting the ratio $B_r$ calculated by the processing in step S23 into Equation (7), and solving the multi-degree equation of x. In this case, the measuring device 1 can improve the accuracy of the distance to be measured compared to when the distance to be measured is calculated based on the approximation equation shown by Equation (8).

The apparatus and methods described above with reference to the various embodiments are merely examples. It goes without saying that they are not confined to the depicted embodiments. While various features have been described in conjunction with the examples outlined above, various alternatives, modifications, variations, and/or improvements of those features and/or examples may be possible. Accordingly, the examples, as set forth above, are intended to be illustrative. Various changes may be made without departing from the broad spirit and scope of the underlying principles.

What is claimed is:

1. A measuring device comprising:
at least two magnetic sensors capable of selectively measuring a magnitude of a component in a specific direction of a magnetic field, the at least two magnetic sensors being arranged lined up in the specific direction and including a first magnetic sensor and a second magnetic sensor, the specific direction being a specific single linear direction;
a processor; and
a memory configured to store computer-readable instructions that, when executed by the processor, instruct the processor to perform processes comprising:
repeatedly acquiring, at a plurality of timings, a measurement value indicating the magnitude of the magnetic field detected by each of the at least two magnetic sensors;
identifying the measurement value having the largest absolute value, from among at least two measurement values acquired at a specific timing from each of the at least two magnetic sensors;
identifying the first magnetic sensor that has detected the identified measurement value having the largest absolute value; and
identifying, based on a time change in the acquired measurement value, a distance in an orthogonal direction that is orthogonal to the specific direction, between an object to be measured and the identified first magnetic sensor.

2. The measuring device according to claim 1, wherein the computer-readable instructions further instruct the processor to perform a process comprising:
identifying a magnitude of a magnetic moment of the object to be measured, based on the measurement value detected by the identified first magnetic sensor, and the identified distance.

3. The measuring device according to claim 1, wherein the identifying the distance includes identifying the distance based on a time change in a first measurement value that is the measurement value detected by the first magnetic sensor, and a time change in a second measurement value that is the measurement value detected by the second magnetic sensor adjacent to the first magnetic sensor.

4. The measuring device according to claim 2, wherein the identifying the distance includes identifying the distance based on a time change in a first measurement value that is the measurement value detected by the first magnetic sensor, and a time change in a second measurement value that is the measurement value detected by the second magnetic sensor adjacent to the first magnetic sensor.

5. The measuring device according to claim 3, wherein the identifying the distance includes identifying the distance based on a following equation showing a ratio of the larger of the time change in the second measurement value and the time change in the first measurement value to the smaller of the time change in the second measurement value and the time change in the first measurement value, $$Br=(p2+x2)3.5/(x5\times(p2-5\times p+x2))$$

(where, the ratio is denoted by Br, the distance is denoted by x, and an interval in the specific direction between the first magnetic sensor and the second magnetic sensor is denoted by p).

6. The measuring device according to claim 4, wherein the identifying the distance includes identifying the distance based on a following equation showing a ratio of the larger of the time change in the second measurement value and the time change in the first measurement value to the smaller of the time change in the second measurement value and the time change in the first measurement value, $$Br=(p2+x2)3.5/(x5\times(p2-5\times p+x2))$$

(where, the ratio is denoted by Br, the distance is denoted by x, and an interval in the specific direction between the first magnetic sensor and the second magnetic sensor is denoted by p).

* * * * *